(12) United States Patent
Matsuki et al.

(10) Patent No.: US 6,232,023 B1
(45) Date of Patent: May 15, 2001

(54) CONTACT EXPOSURE PROCESS AND DEVICE

(75) Inventors: Toshiyuki Matsuki; Yoneta Tanaka, both of Yokohama (JP)

(73) Assignee: Ushiodenki Kabushiki Kaisah, Tokyo (JP)

( * ) Notice: Subject to any disclaimer, the term of this patent is extended or adjusted under 35 U.S.C. 154(b) by 0 days.

(21) Appl. No.: 09/299,748

(22) Filed: Apr. 27, 1999

(30) Foreign Application Priority Data

Apr. 28, 1998 (JP) .................................................. 10-119032

(51) Int. Cl.$^7$ ............................ G03F 7/20; H01L 21/027; G06K 9/00
(52) U.S. Cl. ............................ 430/22; 430/311; 382/151; 356/401
(58) Field of Search .................................. 355/53, 54, 55, 355/86, 95; 430/311, 24, 22; 438/531; 382/151; 356/401

(56) References Cited

U.S. PATENT DOCUMENTS

| | | | |
|---|---|---|---|
| 5,543,890 | 8/1996 | Tanaka et al. ......................... | 355/53 |
| 5,660,381 * | 8/1997 | Suzuki ..................................... | 269/73 |
| 5,777,747 * | 7/1998 | Tanaka .................................. | 356/401 |
| 5,874,190 * | 2/1999 | Tanaka .................................. | 430/22 |
| 5,881,165 * | 3/1999 | Tanaka .................................. | 382/151 |
| 5,940,528 * | 8/1999 | Tanaka et al. ......................... | 382/151 |
| 6,072,915 * | 6/2000 | Tanaka .................................. | 382/287 |

* cited by examiner

Primary Examiner—Shean C. Wu
(74) Attorney, Agent, or Firm—Nixon Peabody LLP; David S. Safran (57) ABSTRACT

A contact exposure device and process in which there is no danger of damage to the mask, and in which the workpiece is not damaged is achieved by a back up ring or the like being provided between a mask carrier and a workpiece carrier. The workpiece carrier and the mask carrier are moved apart from one another by a stipulated distance. The mask and the workpiece are attached by vacuum suction or the like on the mask carrier and the workpiece carrier, respectively. A subatmospheric pressure is produced in the space between the mask and the workpiece. Since the workpiece carrier and the mask carrier are moved apart from one another by a stipulated distance, the mask does bend when the pressure is reduced, but the mask and the workpiece do not come into contact. In this state, air is supplied from a compressor to openings in the workpiece carrier, causing the workpiece to be raised and arranged tightly against the mask, at which point, exposure is performed.

5 Claims, 5 Drawing Sheets

CONTACT EXPOSURE PROCESS AND DEVICE

BACKGROUND OF THE INVENTION

1. Field of the Invention

The present invention relates to the production of electrical and electronic components, parts and the like of various types in which processing of structures in the micron range is necessary using an exposure process. In particular, the invention relates to electronic parts such as semiconductor devices, liquid crystal substrates, micromachines and the like, in which various electronic components and the like are formed on a workpiece using an exposure process in which light is emitted via a mask onto a workpiece on which a mask pattern is exposed. Still further, the invention relates to a contact exposure process in which the mask and the workpiece are located directly tightly adjacent to one another and the mask pattern is transferred to the workpiece which is thin and brittle, such as a printed board made of polyimide or the like (FPC).

2. Description of the Related Art

Figure 5A:
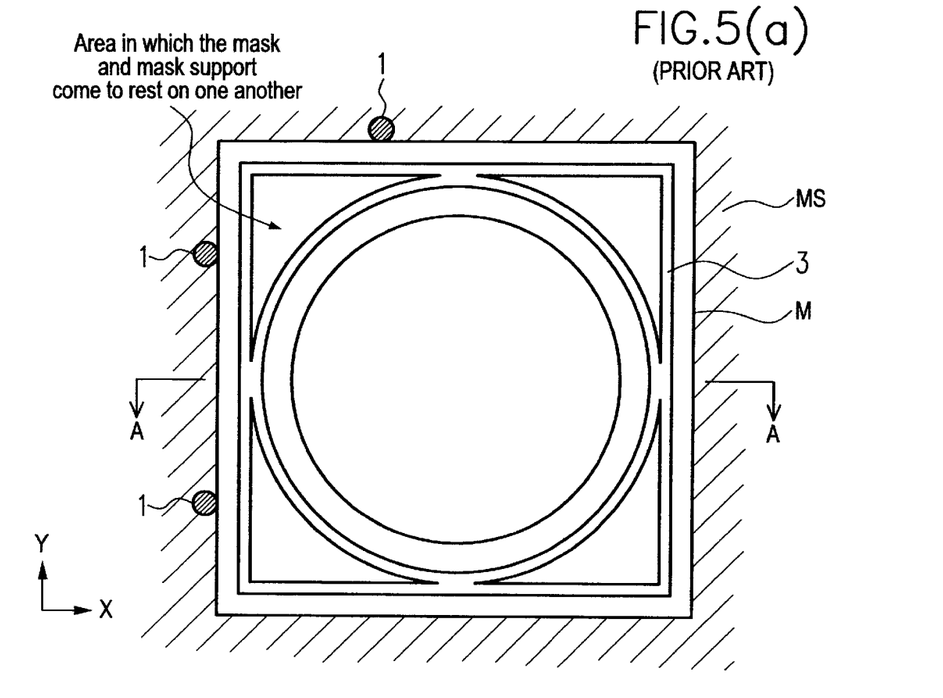
FIGS. 5(a) & 5(b) are plan and cross-sectional views, respectively, of a known contact exposure device.
Figure 5B:
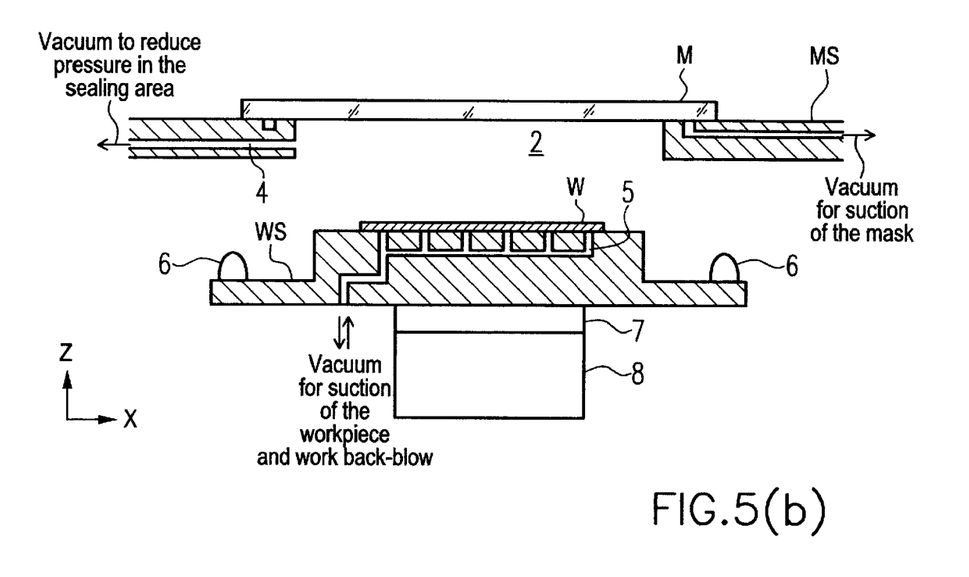

FIGS. 5(a) & 5(b) schematically show a known arrangement of a contact exposure device in which, by means of subatmospheric pressure, the space between the photomask (hereinafter called "mask M") and a workpiece W is subjected to a force with which the mask M and the workpiece W are pressed against one another and in which, thus, the mask and workpiece are arranged directly tightly adjacent to one another and exposure is performed. FIG. 5(a) is an plan view, while FIG. 5(b) is a cross-sectional view corresponding to line A-A in FIG. 5(a).

In the figures, a mask carrier MS is shown with positioning parts 1. Furthermore, the mask carrier MS is provided with an opening 2 so that exposure light is emitted from a light irradiation part (not shown) and directed via the mask M onto the workpiece W.

The mask M in which a mask pattern is formed is seated bordering the positioning parts 1 on the opening 2 with which the mask carrier MS is provided. The vicinity of the circular opening 2 of the mask carrier MS is provided with a suction groove 3. The mask M is attached and restrained on the mask carrier MS by a vacuum which is supplied to the suction groove 3 from a vacuum source (not shown). In the mask carrier MS, there is a passage 4 to reduce the pressure in the space, which is formed by the photomask M, the mask carrier MS, the workpiece W, a workpiece carrier WS and sealing parts 6 made of rubber of the like, to produce a vacuum state in order to hold the mask M and workpiece W directly tightly to one another.

The workpiece carrier WS is provided with a passages 5 for suctioning of the workpiece W to the workpiece carrier WS, so that the workpiece W seated on the workpiece carrier WS is retained on the workpiece carrier WS by a vacuum which is supplied to the passages 5 from a vacuum source (not shown), i.e., the workpiece carrier WS functions as a vacuum chuck.

The workpiece carrier WS is located via a device for adjusting the distance 7 on a workpiece carrier drive device 8 which moves the workpiece carrier WS in the X, Y & Z directions (see legends in FIGS. 5(a) and 5(b), for example), and furthermore, turns it around an axis perpendicular to the surface of the workpiece W, i.e., about the Z axis (hereafter, "movement in the θ-direction"). The shape of the workpiece carrier WS is conventionally matched to the shape of the workpiece W. For example, the workpiece carrier WS is made circular when the workpiece is circular and rectangular when the workpiece W is rectangular, and with the opening 2 being similarly circularly or rectangularly shaped.

In the following, the known process for exposure of the workpiece W using the contact exposure device shown in FIG. 5(a) and 5(b) is described.

(1) The mask M is placed against the positioning parts 1 and seated on the mask carrier MS. Then, a vacuum is supplied to the suction groove 3, by which the mask M is retained on the mask carrier MS.

(2) The workpiece W is seated on the workpiece carrier WS. A vacuum is supplied to the passage 5 from a vacuum source, by which the workpiece W is retained on the workpiece carrier WS.

(3) The workpiece carrier WS is raised by means of the workpiece carrier drive device 8 into contact with the mask M. By means of device 7, the mask M and workpiece W are arranged parallel to one another (the manner in which the "parallel arrangement"0 of the mask M and the workpiece W relative to one another is produced can be found described, for example, in Japanese patent disclosure document HEI 7-74096 and corresponding, U.S. Pat. No. 5,543,890).

(4) After arranging of the mask M and the workpiece W parallel to one another, the workpiece carrier WS is lowered slightly. The distance between the mask M and the workpiece W is set to the alignment distance. By means of an alignment microscope (not shown) the positions of alignment marks which are recorded on the mask M and the workpiece W are determined. The workpiece carrier WS is moved by means of the workpiece carrier drive device 8 in the X-Y-θ directions so as to bring the two alignment marks into agreement with one another. Thus, alignment of the mask M relative to the workpiece W is performed.

Figure 6:
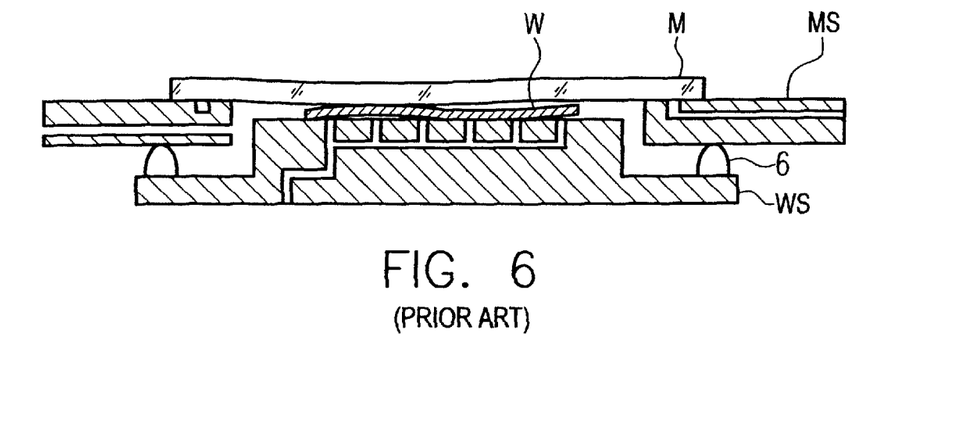
FIG. 6 shows a schematic of the state in which the mask and the workpiece do not tightly adjoin one another in the known device.

(5) After completion of alignment, the workpiece carrier WS is raised and the mask M and the workpiece W are brought into contact with one another. In this case, solely by bringing the mask M and the workpiece W into contact with one another, the mask M and workpiece W cannot be arranged so that they are directly tightly adjacent to one another over all their entire surfaces if the mask M and/or the workpiece W have curvatures, microscopically small concave/convex points and the like. Between the mask M and the workpiece W, therefore, gaps arise in places, as is illustrated in FIG. 6 (in FIG. 6 they are shown exaggerated). If exposure is performed in this state, the exposure power (pattern shape after development) differs after exposure according to the exposed points. To arrange the mask M and the workpiece W over all the surfaces directly tightly adjacent to one another, therefore, the space between mask M and a workpiece W is subject to a force with which the two are pressed against one another, as described above.

(6) The workpiece carrier WS is raised. The mask M and workpiece W are brought into contact with one another. In this way, the vacuum sealing parts 6, in the vicinity of the workpiece carrier WS, come into contact with the bottom of the mask carrier MS. A sealing space is formed by the mask M, the mask carrier MS, the workpiece W, the workpiece carrier WS and the vacuum sealing parts 6. In this state, a vacuum is supplied to the passage 4 located in the mask carrier MS, and thus, the pressure of the above described sealing space is reduced.

Figure 7:
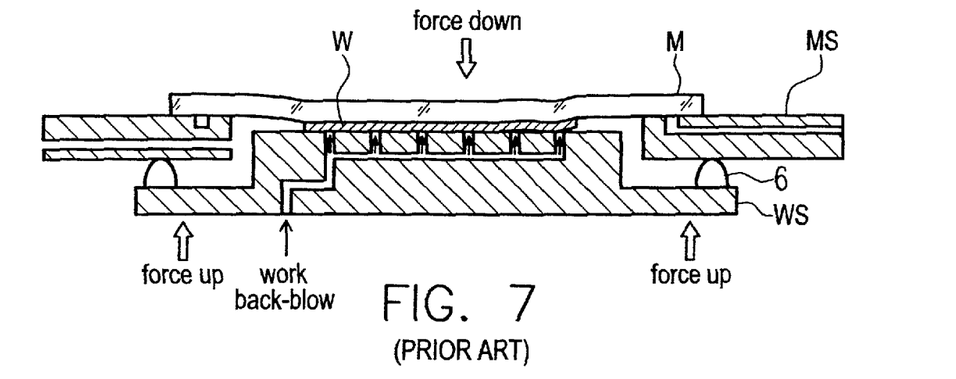
FIG. 7 shows a schematic of the state in which the pressure of the space which is formed by a vacuum sealing area is reduced and in which the mask and the workpiece tightly adjoin one another in the known device.

(7) When the pressure of the sealing space is reduced, the mask M is pressed against the workpiece W so that the mask M and the workpiece W are arranged directly tightly against one another over their entire facing surfaces, as illustrated in FIG. 7.

(8) In the above described state in which the mask M and the workpiece W are arranged directly tightly against one another, light which contains exposure light from a light irradiation part which (not shown) is emitted via the mask M onto the workpiece W, and thus exposure is performed.

As was described above, in the conventional contact exposure process, the pressure of the space between the mask M and the workpiece W is reduced, the mask M is subject to a force which deforms it in such a way that its shape is matched to the shape of the workpiece W, the workpiece W is clamped between the mask M and the workpiece carrier WS, and thus, the mask M and the workpiece W are arranged directly tightly against one another.

Figure 8:
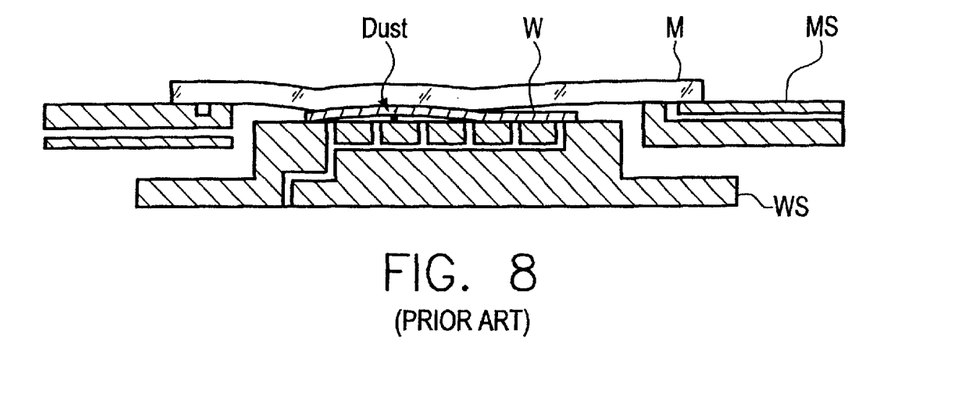
FIG. 8 shows a schematic of the deformation of the workpiece when there are impurities and the like on the workpiece carrier and the mask and the workpiece tightly adjoin one another in the known device.

However, in this conventional process, the workpiece W is deformed when there is, for example, microscopically small dust on the workpiece carrier WS, as is illustrated in FIG. 8. When the mask M and the workpiece W tightly adjoin one another, therefore, the point on the mask M with which the deformed point on the workpiece W comes into contact is exposed to an intense force; this can lead to damaging-of the expensive-mask-M. If exposure is performed using a damaged mask, the damage is transferred in unchanged form to the workpiece W, yielding a faulty product.

Furthermore, the deformed point on the workpiece W is also exposed to an intense force, resulting in the danger of damage to the workpiece W. Especially recently, a workpiece W with a small thickness of roughly 50 to 100 microns has been used more and more often, such as a printed board (FPC) of polyimide or the like. On the other hand, there is a demand for higher image resolution, and accordingly, a tendency toward increasing the contact force between the mask M and the workpiece W. Therefore, there is greater and greater danger of damage to the workpiece W.

SUMMARY OF THE INVENTION

The invention was devised to eliminate the above described defects in the prior art. Thus, a primary object of the present invention is to provide a contact exposure device and process in which a mask and a workpiece are arranged tightly adjacent to one another and exposure can be performed without the danger of damage to the mask and also without damaging the workpiece.

In the above described conventional process, it was considered disadvantageous that the workpiece is deformed, and furthermore, that the mask is damaged and the workpiece is damaged if there is dust and the like on the workpiece carrier WS because the workpiece W is clamped between the mask M and the workpiece carrier WS, and thus, the mask M and workpiece W are arranged tightly against one another.

This object is achieved as follows as claimed in the invention:

The mask and the workpiece are moved apart from one another and are arranged oppositely such that a distance between the two is obtained in which they do not come into contact with one another, even if the pressure of the space between the mask and the workpiece is reduced to a pressure (as is described below) in which the desired contact force can be obtained. The two are caused to approach one another by the subatmospheric pressure in the space between the mask and the workpiece. Afterwards the workpiece is raised by air off the workpiece carrier and thus the mask and the workpiece are arranged tightly adjacent to one another and exposure is performed.

Deformation of the workpiece is prevented by the measure that the mask and the workpiece tightly adjoin one another in the above described manner even if there is dust or the like on the workpiece carrier. In this way, the disadvantages of damage to the mask and damage to the workpiece can be prevented.

In the following the invention is further described using an embodiment shown in the drawings.

DETAILED DESCRIPTION OF THE INVENTION

Figure 1:
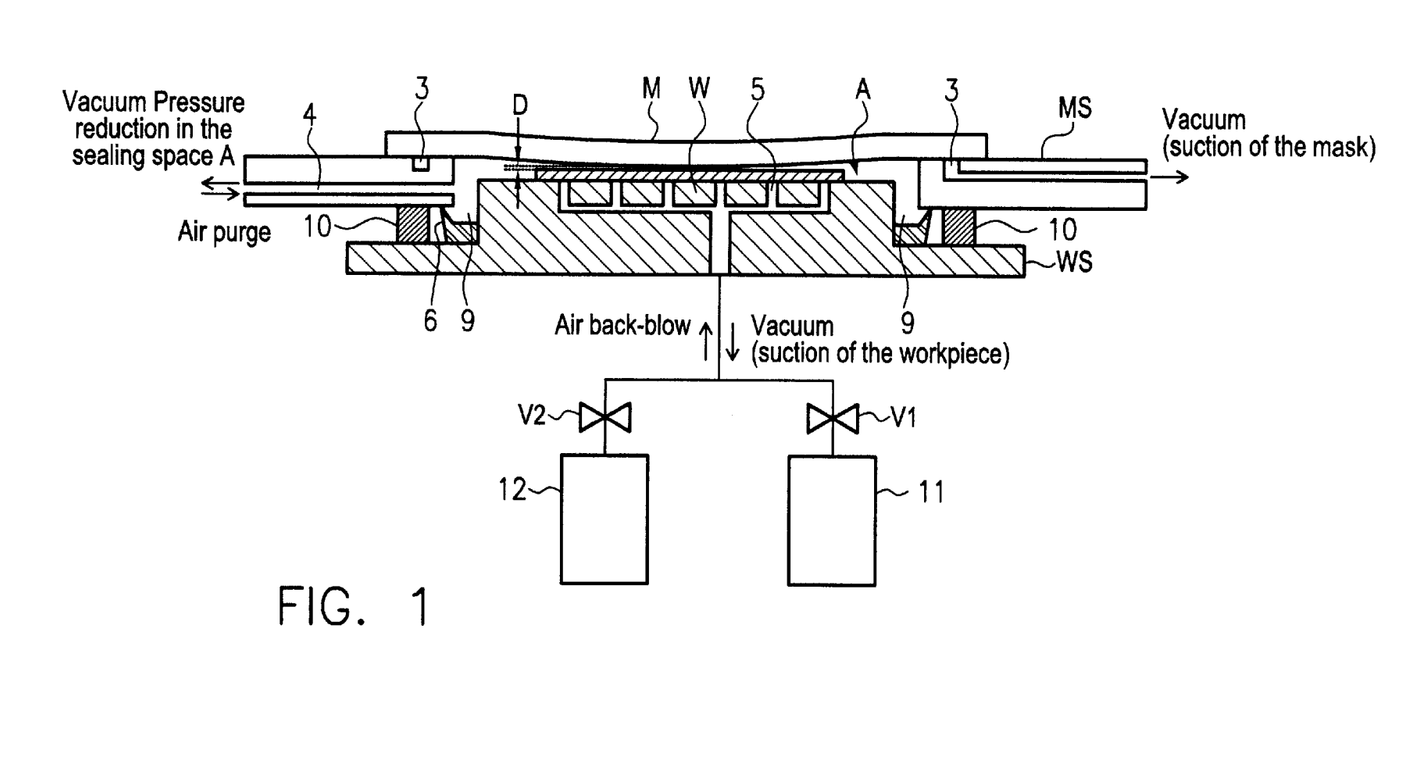
FIG. 1 is a schematic view of the arrangement of one embodiment of the contact exposure device according to the invention.

In FIG. 1, an arrangement of an embodiment of the contact exposure device of the present invention is shown with parts that are the same as parts of the known device of FIGS. 5(a) & 5(b) being labeled with the same reference numbers to facilitate comparison.

In FIG. 1 the vicinity of the opening of the mask carrier MS is provided with a vacuum suction groove 3. The mask M is attached and restrained in the mask carrier MS by a vacuum which is supplied to the vacuum suction groove 3 which is located on the surface of the mask carrier MS. The mask carrier MS is provided with a passage 4 to reduce the pressure of the space A which is formed by the mask M, the mask carrier MS, the workpiece W, the workpiece carrier WS and vacuum sealing parts 6.

The workpiece W is suctioned and attached in the workpiece carrier WS. Furthermore, the workpiece carrier WS is provided with a groove 5 for blowing in a gas, such as air or the like, onto the workpiece W and for lifting the workpiece W.

The groove 5 is connected to a vacuum pump 11 and a compressor 12 via a valve V1 and a valve V2. By opening the valve V1 and routing the vacuum from the vacuum pump 11 into the groove 5, the workpiece W is retained on the workpiece carrier WS. By opening the valve V2 and routing the air from the compressor 12 into the groove 5, the workpiece W is raised and pressed against the surface of the mask M (supply of air to the workpiece carrier WS and lifting of the workpiece W from the workpiece carrier WS is called "back-blowing" of the workpiece W).

The vicinity of the workpiece carrier WS is provided with vacuum sealing parts 6 that are made, for example, of rubber or the like. The vacuum sealing area 9 is used to produce a vacuum state to tightly arrange the mask M and the workpiece W directly against one another.

The workpiece carrier WS is located via a device for adjusting the distance 7 on a workpiece carrier drive device 8 (corresponding to that shown in FIG. 5(b) for the known device) which moves the workpiece carrier WS in the X direction (for example, to the left and right in FIG. 1), the Y direction (for example, perpendicularly in and out of the page of the FIG. 1 drawing) and the Z direction (up and down in FIG. 1), and furthermore, turns it around a Z direction axis, perpendicular to the surface of the workpiece W (this rotation is called "movement in the θ-direction"), as was described above with reference to FIGS. 5(a) and 5(b).

The vicinity of the workpiece carrier WS is provided with a back up ring 10. The top of the back up ring 10 is machined with high precision and borders the bottom of the mask carrier MS when the workpiece carrier WS is raised.

The back up ring 10 operates as follows:
(1) The bottom of the mask M and the top of the workpiece W are held apart from one another by the back up ring 10 which is arranged adjoining the bottom of the mask carrier such that there is a stipulated distance between the mask M and workpiece W.
(2) The sealing space A is exposed to subatrnospheric pressure, the back up ring 10 prevents the workpiece carrier WS from moving in the direction to the mask carrier MS. In this way, a gap D is preserved between the mask M and workpiece W that is less than the distance in the above described arrangement which has been moved apart and at the same time at the distance at which the mask and workpiece do not come into contact with one another.
(3) The parallel arrangement of the workpiece carrier WS relative to the mask carrier MS is preserved.

Figures 2A, 2B:
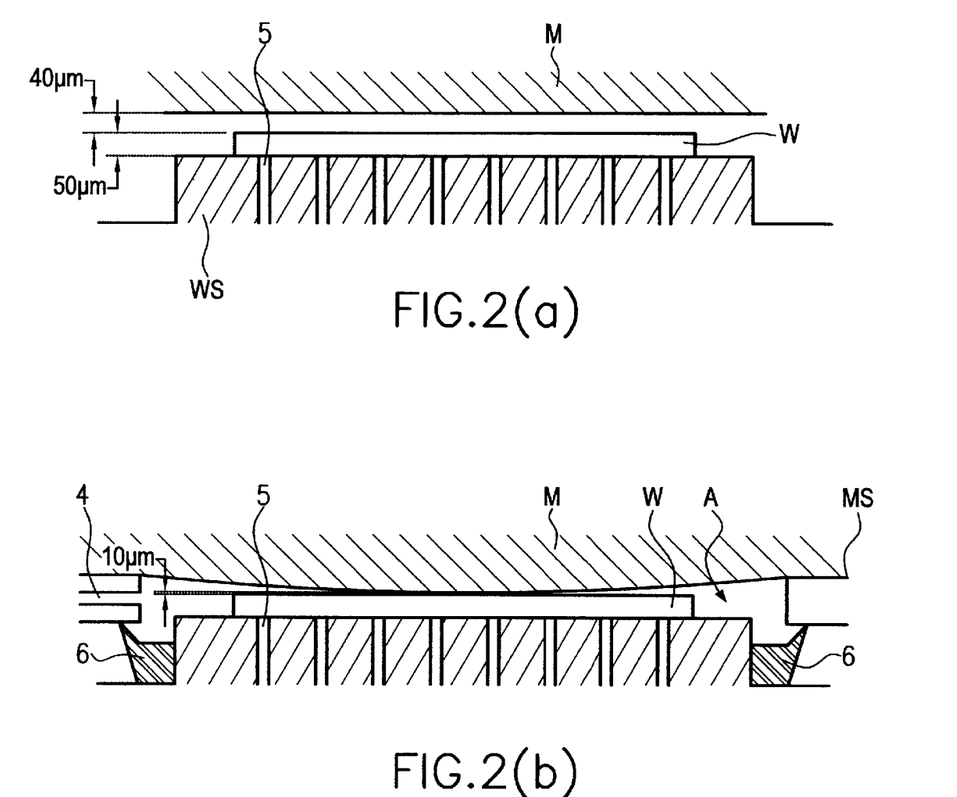
FIGS. 2(a) & 2(b) each shown schematic cross-sectional view of the positional relationship between the mask and the workpiece in the embodiment of the invention.
Figure 3:
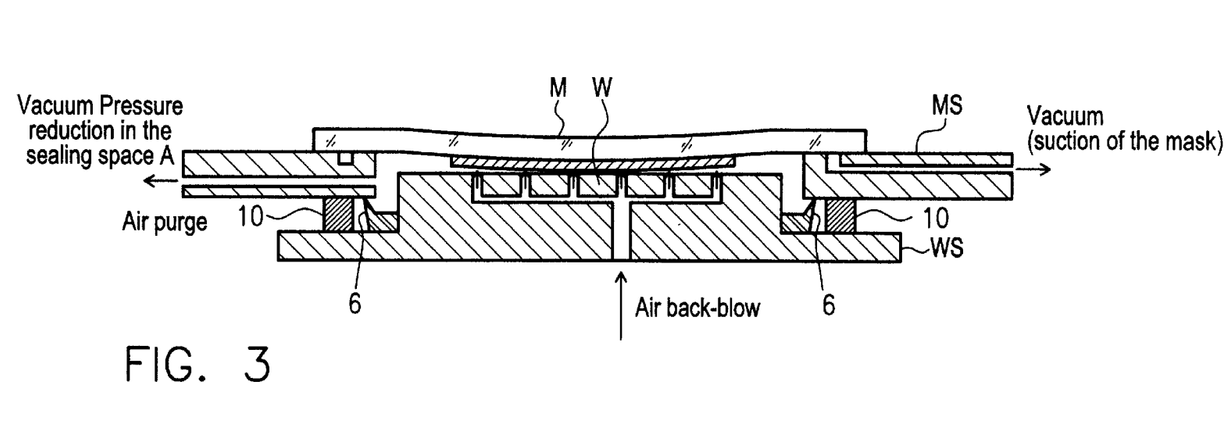
FIG. 3 shows a schematic of the state in the embodiment of the invention in which the mask and the workpiece tightly adjoin one another by "back-blow"
Figure 4:
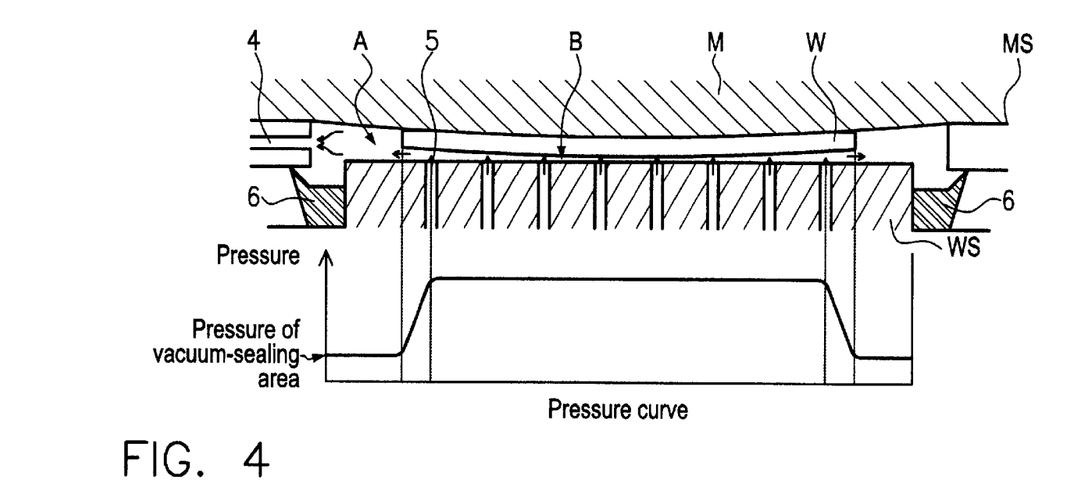
FIG. 4 is a schematic cross-sectional view of the workpiece state and a pressure curve during "back-blow" in the embodiment of the invention.

In the following, the exposure process is described using the contact exposure device in this embodiment.
(1) The mask M is seated on the mask carrier MS. A vacuum is supplied to the vacuum suction groove 3 of the mask carrier MS. The mask M is retained on the mask carrier MS.
(2) The workpiece W is seated on the workpiece carrier WS. The valve V1 is opened. The valve V2 is closed. A vacuum from the vacuum pump 11 is supplied to the groove 5 of the workpiece carrier WS. The workpiece W is retained on the workpiece carrier WS.
(3) The workpiece carrier WS is raised by a workpiece drive device (not shown). In this way, the top of the back up ring 10 borders the bottom of the mask carrier MS. Then, the mask M and workpiece W are arranged parallel to one another by means of a device for adjusting the distance (not shown). A back up ring 10 is located between the mask carrier MS and the workpiece carrier WS. Therefore, the mask M and the workpiece W cannot be brought directly into contact with one another. In the above described parallel arrangement, therefore, the workpiece carrier WS is raised, the tilt of the workpiece carrier WS is set by means of the device for adjusting the distance such that the entire top surface of the back up ring 10 comes into contact with the bottom of the mask carrier MS and thus parallel arrangement is accomplished.
(4) The workpiece carrier WS is lowered. The distance between the mask M and the workpiece W is set to the alignment distance. By means of an alignment microscope (not shown), the location of the alignment marks which are recorded on the mask M and the workpiece W are determined. The workpiece carrier WS is moved by means of the workpiece carrier movement device in the X-Y-θdirections such that the two alignment marks are brought into positional agreement with one another. Thus, positioning (alignment) of the mask M relative to the workpiece W is achieved.
(5) After completion of alignment, the workpiece carrier WS is raised. The top of the support ring 10 thus borders the bottom of the mask carrier MS. In this way, the distance between the bottom of the mask M and the top of the workpiece W is kept at a stipulated value. By changing the height of the back up ring 10, the size of the above described stipulated gap can be changed. In this embodiment, the distance between the mask M and the workpiece W is set according to FIG. 2(a). This means that the gap between the mask carrier MS and the workpiece carrier WS was set such that, at a thickness of the workpiece W of roughly 50 microns, the gap between the bottom of the mask M and the top of the workpiece W is roughly 40 microns. Here, the ratio between the gap between the mask carrier MS and the workpiece carrier WS and the thickness of the workpiece W is 4:5.
(6) In this way, the vacuum seal 6 in the vicinity of the workpiece carrier WS comes into contact with the bottom of the mask carrier MS by the top of the back up ring 10 bordering the bottom of the mask carrier MS. The sealing space A is formed by the mask M, the mask carrier MS, the workpiece W, the workpiece carrier WS and the vacuum seal 6. In this state, a vacuum is supplied to the passage 4 located in the mask carrier MS, and thus, the sealing space A is exposed to subatmospheric pressure. The mask M is exposed to atmospheric pressure at its opposite side and thus bends in the direction toward the workpiece carrier WS. This means that, by the subatmospheric pressure in the sealing space A, the mask M is exposed to subatmospheric pressure and bends in the direction to the workpiece W, as is illustrated in FIG. 2(b). The workpiece carrier WS and the mask M are exposed to atmospheric pressure. The direction toward the mask carrier MS (to the top in the drawing) is thus subject to a force. However, since the back up ring 10 is present, the workpiece carrier WS does not move. The mask M and the workpiece W therefore do not come into contact with one another. The gap between the mask M and the workpiece W in the middle area of the mask is kept at roughly 10 microns, as is illustrated in FIG. 2(b).
(7) The valve V1 is closed. The valve V2 is opened. Air is supplied to the groove 5 of the workpiece carrier WS. The workpiece 5 is raised off the workpiece carrier WS and is pressed against the mask M (back-blowing of the workpiece W is performed). In this way, the mask M and the workpiece W directly tightly pressed against another, as is illustrated in FIG. 3. The workpiece W cannot tightly adjoin the mask M when only back-blowing is performed without reducing the pressure of the sealing space A between the workpiece W and the mask M. This is because air can collect between the workpiece W and the mask M air can collect when an attempt is made to press the workpiece W against the mask M. On the other hand, if the pressure of the sealing space A is reduced, as was described above, the air between the workpiece W and the mask M is evacuated when the workpiece W and the mask M come to rest tightly against one another, and then it becomes possible to prevent the accumulated air from remaining. In the following, the state is described in which the workpiece W is in contact with the mask M by "back-blow."0 As illustrated in FIG. 4, back-blowing forms a space B which is essentially surrounded by the workpiece carrier WS and the workpiece W. The pressure of space B is higher than the pressure of the sealing space A.

The pressure ratio is shown by the lower part of FIG. 4. The air of the back-blow flows (leaks) from the gap between the edge of the workpiece W and the workpiece carrier WS in the direction to the sealing space A. The distance of this gap is less than 40 microns because the mask M is bent in the direction to the workpiece W. The gap between the edge of the workpiece W and the workpiece carrier WS therefore becomes small. Therefore, the air of the back-blow cannot leak suddenly in the direction to the sealing space A. The pressure distribution on the bottom of the workpiece W is therefore essentially flat, as is illustrated in FIG. 4. The pressure due to the back-blow which has arisen in space B which is surrounded by the workpiece carrier WS and the workpiece W is essentially preserved over the entire surface of the workpiece W. Thus, the workpiece W is pressed against the underside of the mask M. Furthermore, the bending of the mask M is reduced by back-blow. The mask M and the workpiece W move slightly upward.

The pressure of the peripheral area of the workpiece W from which the air leaks approaches the pressure of the sealing space A. The force with which the workpiece W is pressed against the mask M therefore becomes weak. The adherence to the mask M is therefore adversely affected according to the pressure curve in FIG. 4. However, since usually a pattern like a circuit or the like is not formed in the peripheral area of the workpiece W, no problem arises even if the workpiece W and mask M do not tightly adjoin one another in that area.

(8) In this state, light which contains exposure light from a light irradiation part (not shown) is emitted via the mask M onto the workpiece W, and thus exposure is performed. In the above described embodiment, a case was described in which the gap between the mask M and the workpiece W is set to 40 microns. If the distance between the mask M and the workpiece W is too large, there are, however, cases in which the workpiece W moves in the transverse direction (X-Y directions) during back-blowing of the workpiece W. If the distance between the mask M and the workpiece W is too small, with a subatmospheric pressure in the sealing space A, there is the danger that the mask M will come into contact with the workpiece W and both the mask M and the workpiece W will be damaged.

Therefore, it is necessary for the size of the workpiece W, the thickness of the mask M and the like to be considered to determine the optimum values for the pressure in the sealing space A, the back-blow pressure and similar conditions, and to set the distance between the mask M and the workpiece W.

Generally, the contact force between the mask M and the workpiece W depends on the pressure (degree of vacuum) of the sealing space A. Therefore, based on the required contact force, the pressure (degree of vacuum) of the sealing space A can be fixed, based on the pressure of the sealing space A, the size of the workpiece W and the thickness of the mask M, the amount of bending of the mask M can be determined and the distance between the mask M and the workpiece W can be established such that, when the mask M bends as a result of subatmospheric pressure in the sealing space A, the mask M and the workpiece W do not come into contact with one another.

In this embodiment, a workpiece with a diameter of 150 mm of thin copper foil is used. In the case of a mask thickness of 3.8 mm, the pressure of the vacuum sealing area was fixed at 20kPa(1 atm=760 mm; Hg =101.3 kPa.;20 kPa corresponds to roughly 150 mmHg), the back-blow . pressure was set to 2 kPa and the gap between the bottom of the middle area of the mask and the top of the workpiece was set to 40 microns. In this case, the gap between the mask M and the workpiece W at subatmospheric pressure was roughly 10 microns and exposure can be performed with high precision.

In the above described embodiment, a case was described in which the back up ring 10 is used as the means for setting the gap between the mask M and the workpiece W. The means for setting the gap between the two is, however, not limited to the back up ring 10. In accordance with the invention, any means is adequate which prevents the workpiece carrier WS from being exposed to atmospheric pressure and being raised by subatmospheric pressure in the space between the mask M and the workpiece W, and as a result, the set gap between the mask M and the workpiece W can continue to be preserved.

For example, there is also a process in which a Z-movement device of a workpiece carrier movement device is strongly braked so that the workpiece carrier WS can no longer move.

This means that a device such as a cross roller or the like is used for a movable part of the above described device for gap setting (see, for example, Japanese patent disclosure document HEI 7-74096 and corresponding U.S. Pat. No. 5,543,890) or a workpiece carrier drive device (see, for example, Japanese patent disclosure document HEI 8-25163 and corresponding U.S. Pat. No. 5,660,381). This yields an arrangement in which the workpiece carrier WS is not raised upward even when the workpiece carrier WS is subject to a force. Thus, a motor or the like which drives the workpiece carrier WS in the Z-direction (up and down) can be strongly braked and the workpiece carrier WS can be prevented from moving upward when the gap between the mask carrier MS and the workpiece carrier WS is kept constant.

ACTION OF THE INVENTION

As was described above, in accordance with the invention, the mask and the workpiece are arranged at a stipulated distance relative to one another, in which they do not come into contact with one another even if the space between the mask and the workpiece is exposed to a subatmospheric pressure. In the space between the mask and workpiece, in this state, a subatmospheric pressure is produced. Then, a back-blow of air is accomplished by the workpiece carrier. The workpiece is raised and arranged tightly adjacent to the mask, and in this state, exposure is performed. This measure according to the invention prevents the workpiece from being pressed by the mask against the workpiece carrier when a subatmospheric pressure is produced in the space between the mask and the workpiece. Therefore, a part of the mask and of the workpiece is prevented from being exposed to an intense force even if there are foreign bodies, such as impurities and the like on the workpiece carrier. This can prevent damage to the mask and workpiece.

We claim:

1. Contact exposure process in which a workpiece with a surface coated with a light-sensitive film and being placed on a workpiece carrier, and a mask provided with a mask pattern are arranged tightly against one another, and light which contains exposure light is emitted through the mask onto the workpiece, exposing the mask pattern onto the workpiece, comprising steps of:

moving the mask and the workpiece apart and placing facing one another with a space between them;

reducing the pressure in the space between the mask and the workpiece and causing them to approach one another;

subsequently lifting the workpiece off the workpiece carrier by blowing in air so as to place the mask and the workpiece tightly against one another; and performing exposure of the mask pattern onto the workpiece.

2. Contact exposure device comprising a mask carrier for holding a mask and a workpiece carrier for holding a workpiece, a device for setting a stipulated distance between the mask carrier and the workpiece at which a space is formed which is sealed by vacuum seals located between the mask carrier and the workpiece carrier, the space being bounded by the mask carrier, mask, workpiece and workpiece carrier, and a vacuum line for producing a subatmospheric pressure within said space; wherein the workpiece carrier is provided with openings on a surface for holding the workpiece, the opening being connected to a feed line to which a vacuum device and an air injection device are connected.

3. Contact exposure device as claimed in claim 2, wherein the device for setting a stipulated distance comprises at least one spacer.

4. Contact exposure device as claimed in claim 3, wherein the spacer is a back up ring.

5. Contact exposure device as claimed in claim 4, wherein the back up ring is located on the workpiece carrier.

* * * * *